(12) United States Patent
Taniguchi et al.

(10) Patent No.: US 11,046,910 B2
(45) Date of Patent: Jun. 29, 2021

(54) CLEANING SOLUTION COMPOSITION

(71) Applicant: Kanto Kagaku Kabushiki Kaisha, Tokyo (JP)

(72) Inventors: Yumiko Taniguchi, Saitama (JP); Areji Takanaka, Saitama (JP); Takuo Ohwada, Saitama (JP)

(73) Assignee: KANTO KAGAKU KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/497,508

(22) PCT Filed: Mar. 5, 2018

(86) PCT No.: PCT/JP2018/008378
§ 371 (c)(1),
(2) Date: Sep. 25, 2019

(87) PCT Pub. No.: WO2018/180256
PCT Pub. Date: Oct. 4, 2018

(65) Prior Publication Data
US 2020/0017801 A1  Jan. 16, 2020

(30) Foreign Application Priority Data

Mar. 31, 2017 (JP) .............................. JP2017-071074

(51) Int. Cl.
*C11D 7/08* (2006.01)
*C11D 1/00* (2006.01)
(Continued)

(52) U.S. Cl.
CPC .............. *C11D 1/004* (2013.01); *C11D 1/22* (2013.01); *C11D 3/0042* (2013.01);
(Continued)

(58) Field of Classification Search
CPC .................................................. C11D 11/0047
(Continued)

(56) References Cited

U.S. PATENT DOCUMENTS 6,787,293 B2 * 9/2004 Oowada .................. G03F 7/423
430/329
2003/0089891 A1 * 5/2003 Andreas .............. H01L 21/3212
252/500

(Continued)

FOREIGN PATENT DOCUMENTS

| JP | 2004-292792 A | 10/2004 |
| JP | 2012-134357 A | 7/2012 |
| SG | 182949 A1 | 8/2012 |

OTHER PUBLICATIONS

Extended European Search Report for Application No. EP 18777031 dated Dec. 11, 2020.

*Primary Examiner* — Gregory E Webb
(74) *Attorney, Agent, or Firm* — McDonnell Boehnen Hulbert & Berghoff LLP

(57) ABSTRACT

Provided is a cleaning solution composition which, when cleaning the surface of a semiconductor substrate or glass substrate, does not damage $SiO_2$, $Si_3N_4$, Si, and the like forming a layer on the substrate surface, can be used under processing conditions applicable to a brush scrub cleaning chamber equipped with a CMP apparatus, and can efficiently remove compounds derived from abrasive particles in a slurry. This cleaning solution composition for cleaning the surface of a semiconductor substrate or glass substrate (Continued)

contains: one or two or more fluorine atom-containing inorganic acids or salts thereof; water; one or two or more reducing agents; and one or two or more anionic surfactants, and has a hydrogen ion concentration (pH) of less than 7.

9 Claims, 8 Drawing Sheets

(51) Int. Cl.
    C11D 1/22      (2006.01)
    C11D 3/00      (2006.01)
    C11D 3/20      (2006.01)
    C11D 11/00     (2006.01)
    H01L 21/02     (2006.01)
    H01L 21/304    (2006.01)
    H01L 21/311    (2006.01)

(52) U.S. Cl.
    CPC .............. *C11D 3/2003* (2013.01); *C11D 7/08* (2013.01); *C11D 11/0035* (2013.01); *C11D 11/0047* (2013.01); *H01L 21/02074* (2013.01); *H01L 21/304* (2013.01); *H01L 21/31133* (2013.01)

(58) Field of Classification Search
    USPC ........................................................ 510/175
    See application file for complete search history.

(56) References Cited

U.S. PATENT DOCUMENTS

| | | | |
|---|---|---|---|
| 2003/0171239 A1* | 9/2003 | Patel | C11D 3/30 510/406 |
| 2003/0232173 A1 | 12/2003 | Saito et al. | |
| 2006/0115970 A1* | 6/2006 | Lee | C11D 7/3209 438/584 |
| 2006/0270573 A1* | 11/2006 | Ikemoto | C11D 3/30 510/175 |
| 2011/0021400 A1* | 1/2011 | Mizuta | G03F 7/426 510/176 |
| 2011/0245127 A1 | 10/2011 | Suzuki et al. | |
| 2012/0065116 A1 | 3/2012 | Miyashita | |
| 2013/0225464 A1* | 8/2013 | Harada | C11D 11/0047 510/175 |
| 2014/0128307 A1* | 5/2014 | Chhabra | C11D 7/08 510/175 |
| 2014/0371124 A1* | 12/2014 | Harada | C11D 3/2079 510/175 |
| 2019/0136161 A1* | 5/2019 | Kamimura | C11D 7/268 |

* cited by examiner

[Fig. 1]
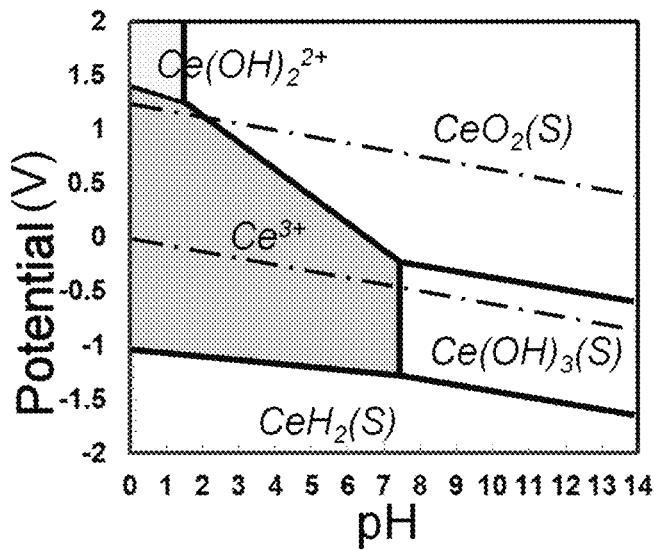
[Fig. 2]
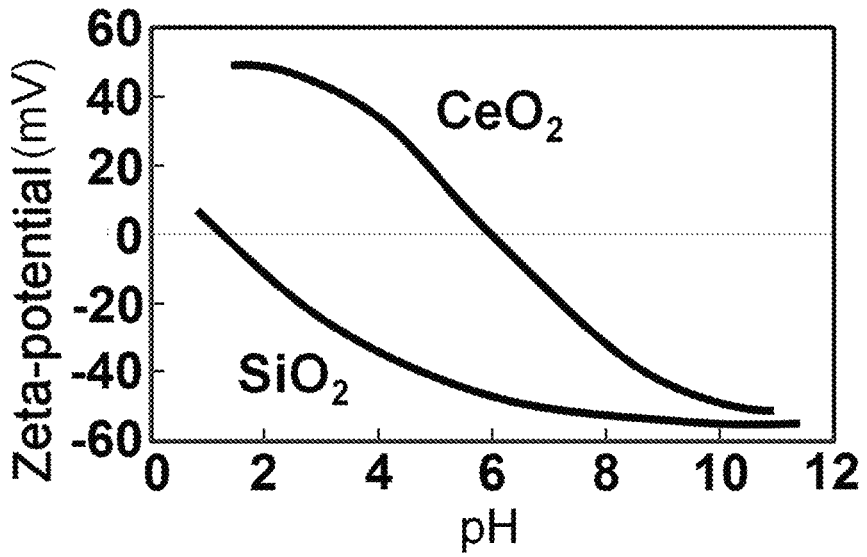

[Fig. 3]
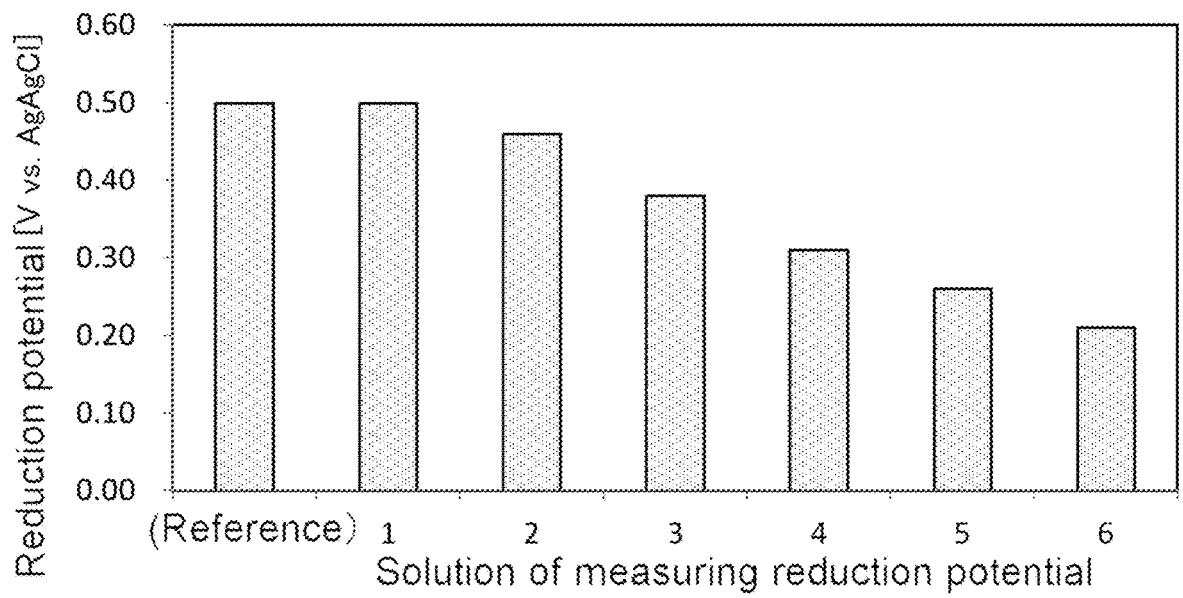
[Fig. 4]
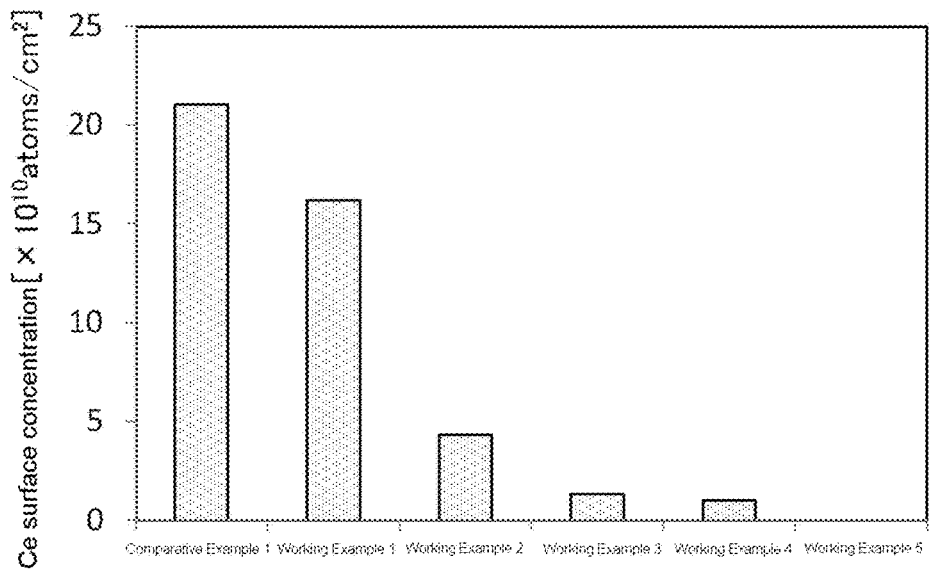

[Fig. 5]
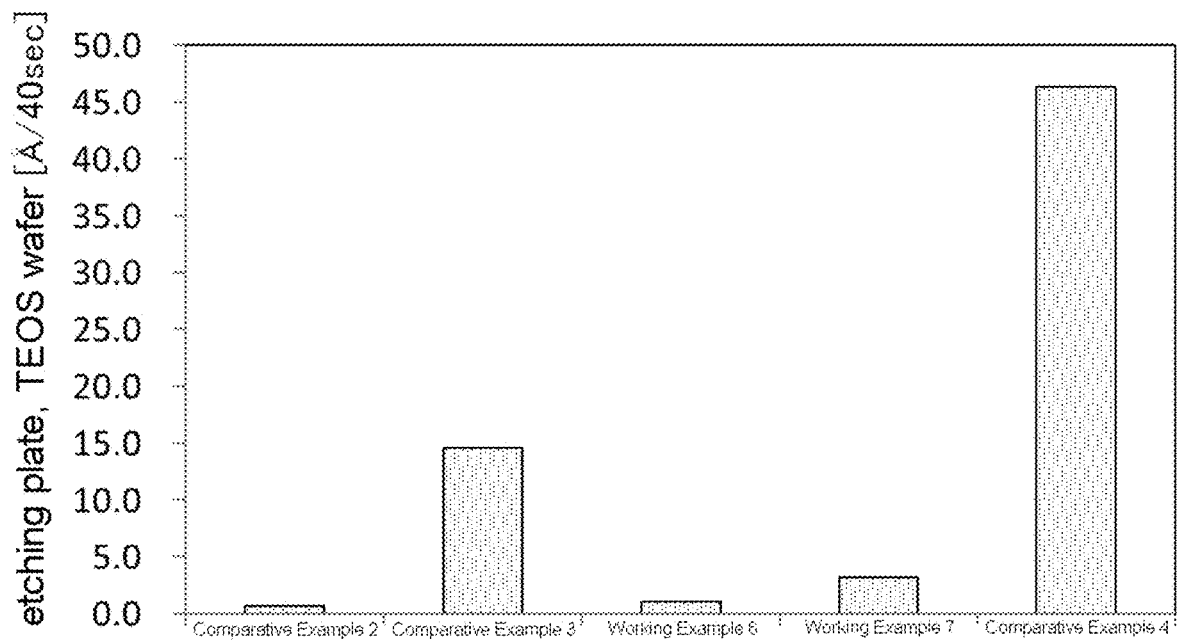
[Fig. 6]
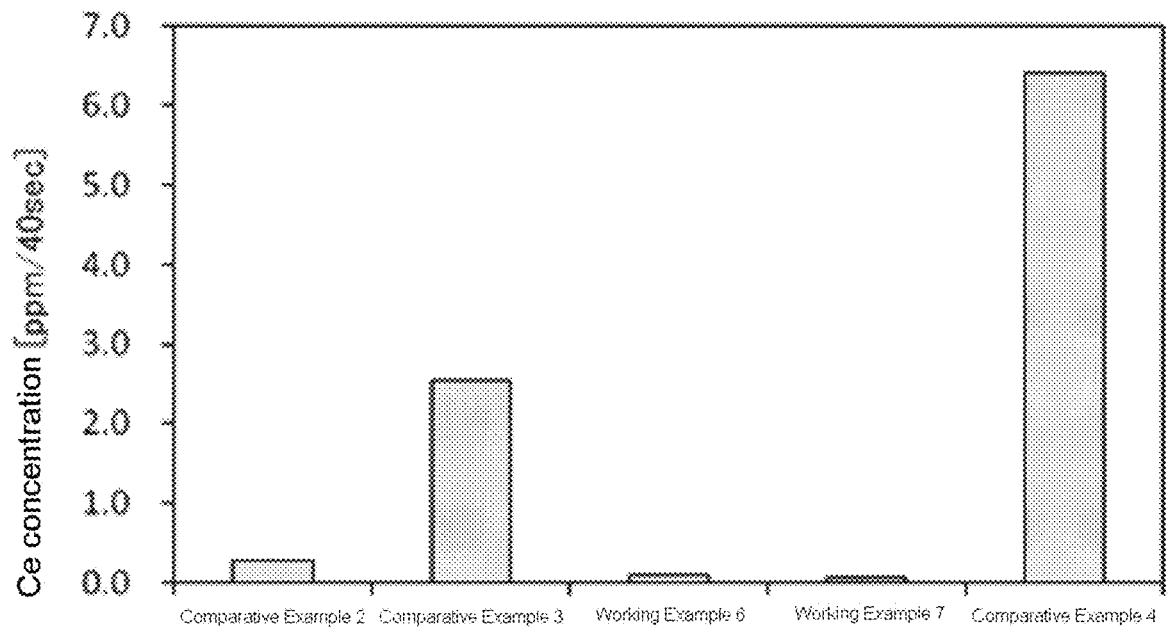

[Fig. 7]
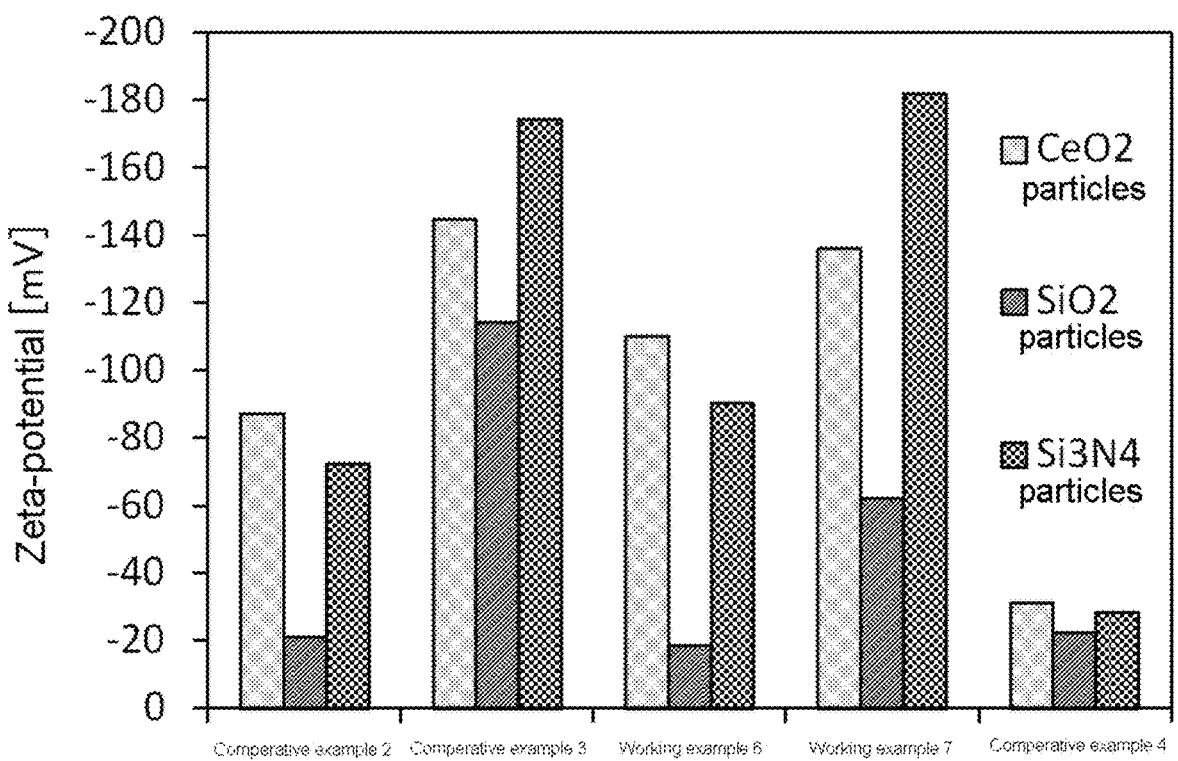
[Fig. 8]
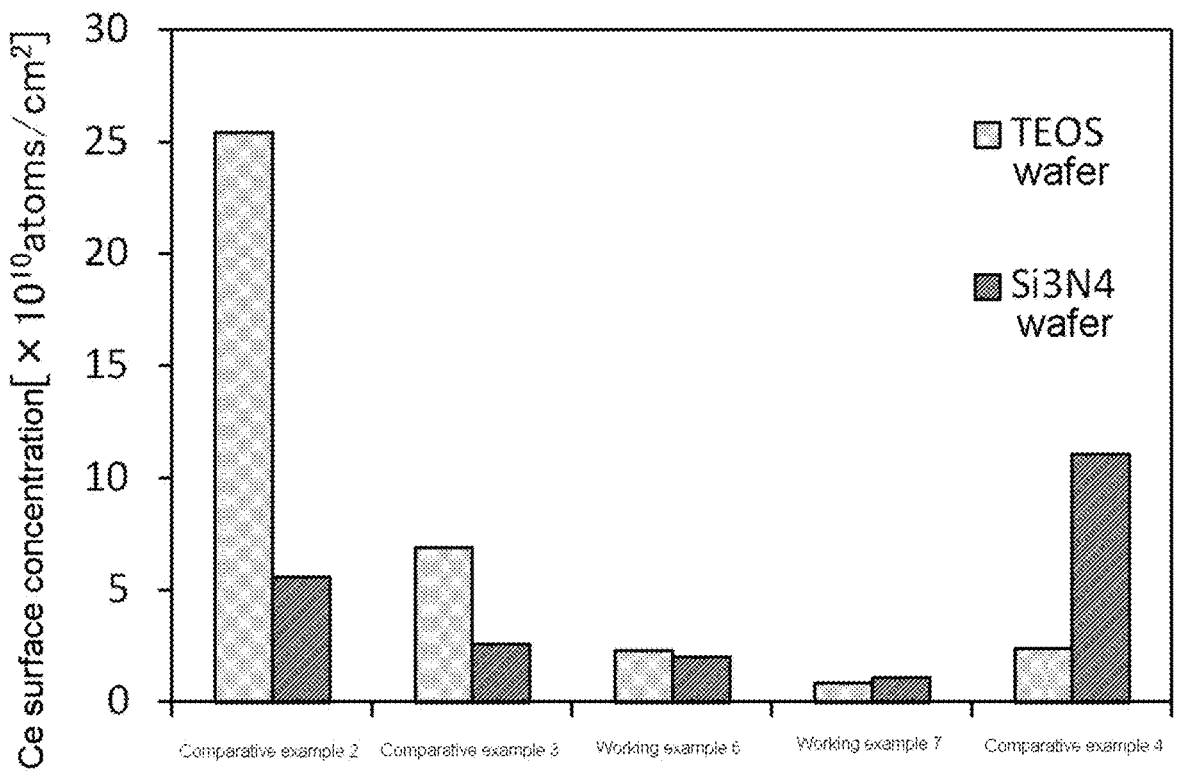

[Fig. 9]
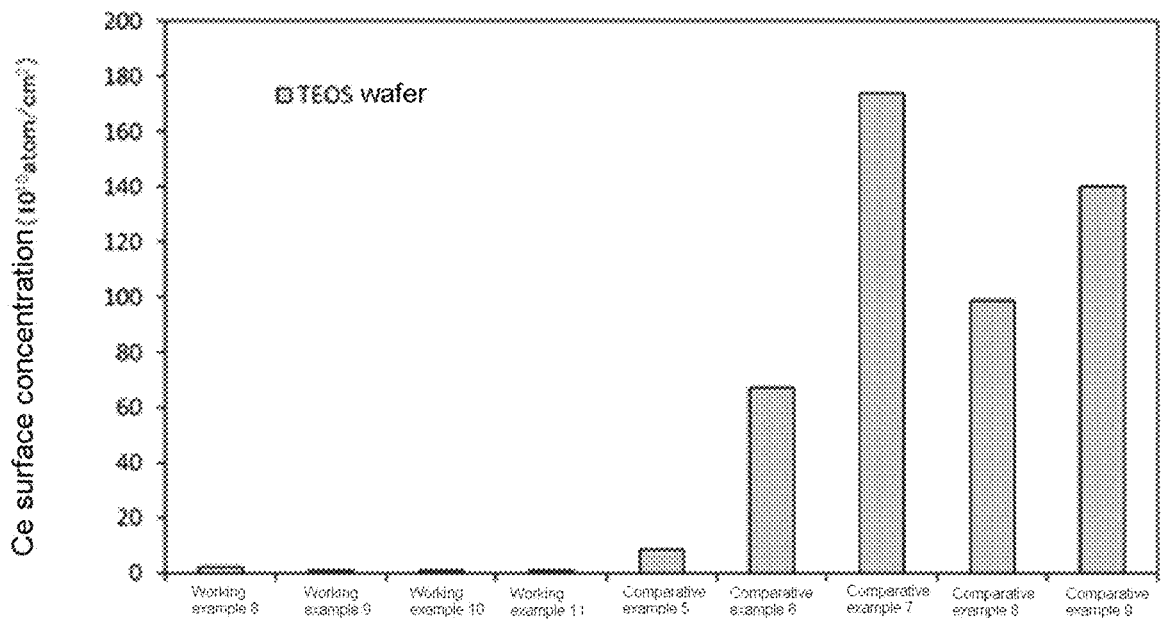
[Fig. 10]
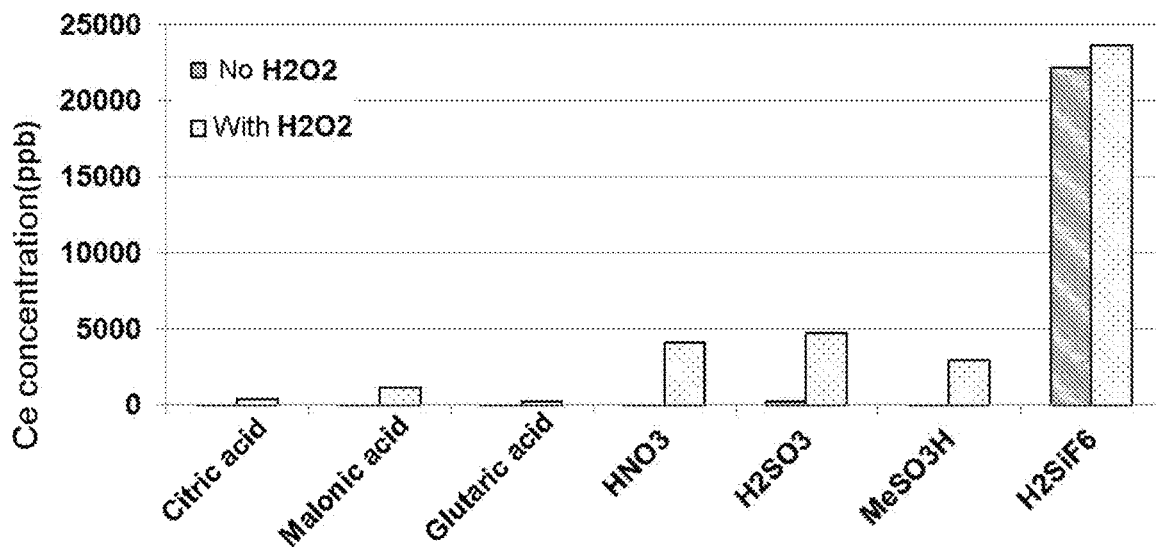

[Fig. 11]
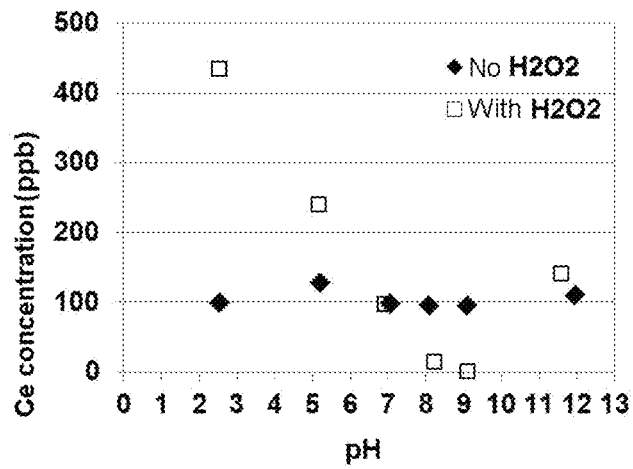
[Fig. 12]
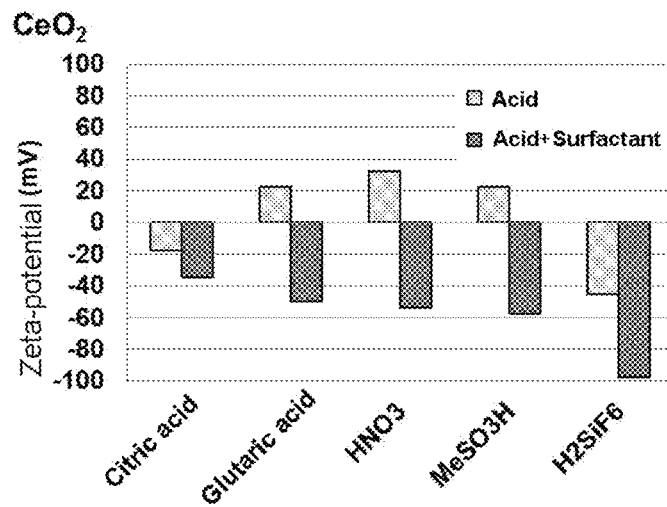
[Fig. 13]
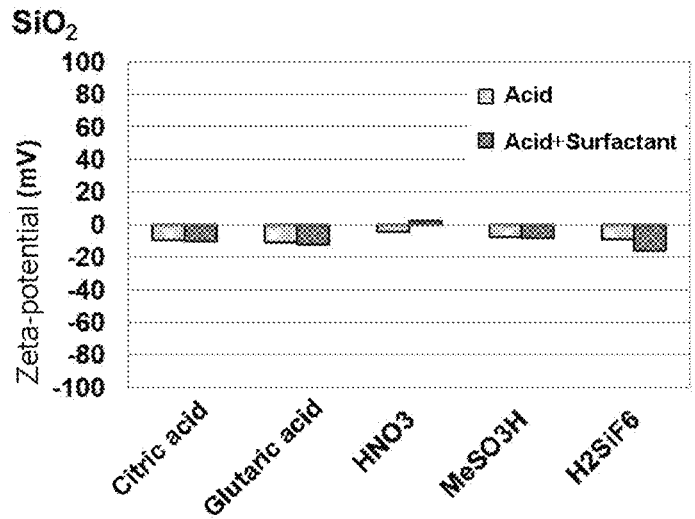

[Fig. 14]
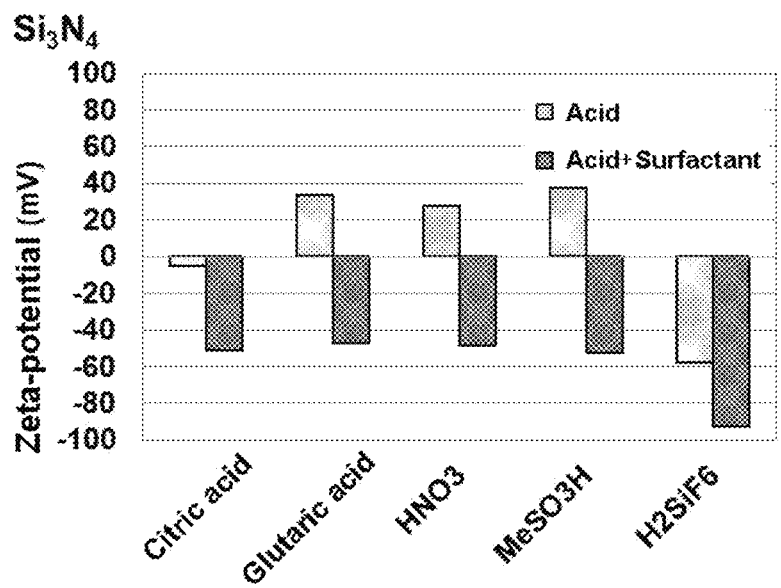
[Fig. 15]
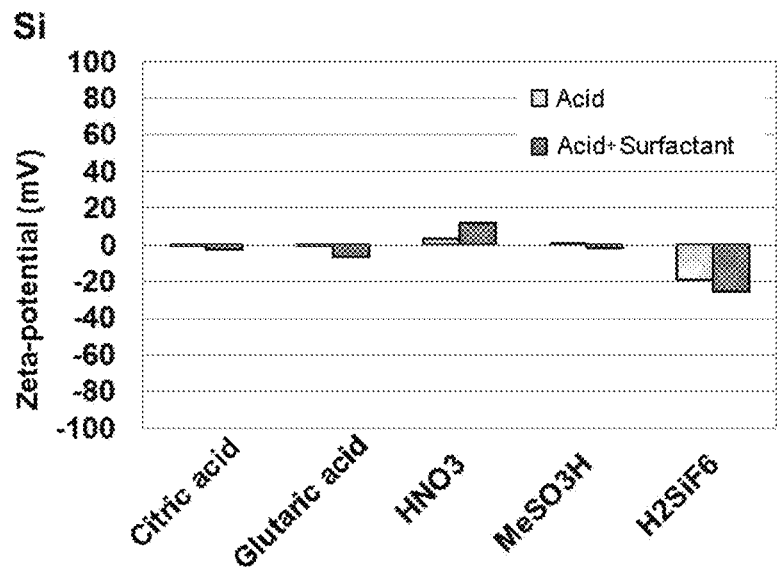

[Fig. 16]
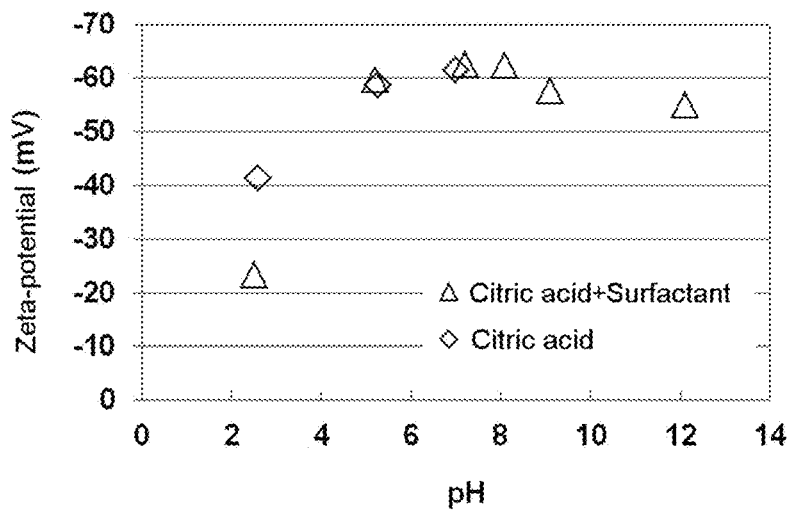
[Fig. 17]
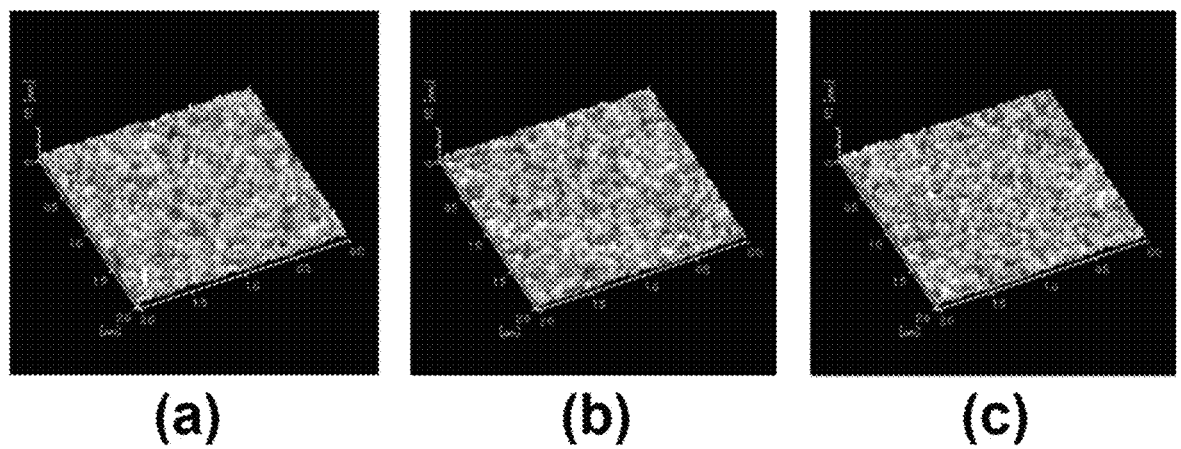
(a)        (b)        (c)
[Fig. 18]
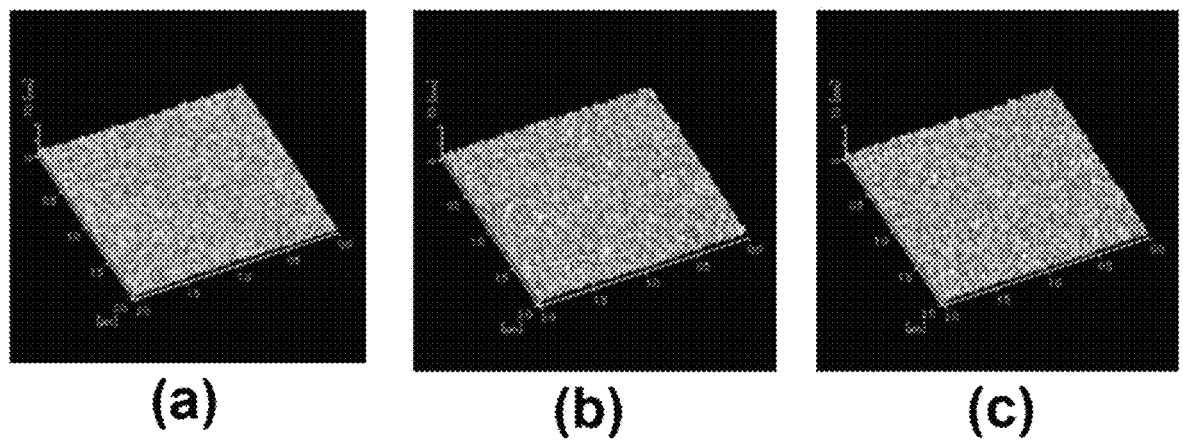
(a)        (b)        (c)

CLEANING SOLUTION COMPOSITION

This application is a U.S. National Phase application under 35 U.S.C. § 371 of PCT/JP2018/008378, filed Mar. 5, 2018, which claims priority from and the benefit of Japanese Application No.: 2017-071074, filed on Mar. 31, 2017, the specifications of which are hereby incorporated by reference in their entireties.

TECHNICAL FIELD

The present invention relates to a cleaning solution composition and a stock solution composition for the cleaning solution composition as well as a method of manufacturing a electronic device using the cleaning composition.

BACKGROUND ARTS

As integrated circuits (ICs) become more highly integrated, a strict contamination control has been required, because contamination by trace amount of impurities would greatly influence on the performance and yield of the device. Namely, a strict contamination control of the substrate has been required, and, to this end, various cleaning solutions are being used in each step of the manufacture of a semiconductor substrate.

In recent years, as refinement and multilayer wiring structuralization of devices has proceeded, more delicate planarization of substrate has been required in each step. To this end, chemical machine polishing (CMP) technique has been introduced into the processes of the manufacture of a semiconductor substrate as a new technique, which supplies a mixed slurry of abrasive particles and chemical agents while crimping the wafer to an abrasive cloth called buff, rotating it, and thereby using chemical and physical effects in combination to polish and planarize insulating films and metal materials.

Recently, high-speed polishing has been required due to an increase in the number of layers. In particular, in three-dimensional NAND flash memory in which memory cells are sterically laminated, the development of which has been proceeded because improvement of memory capacity by refinement has become difficult, high-speed polishing is essential for improving through-put and reducing costs because it is necessary to polish insulating films having yet more layers.

Furthermore, in the processes of forming an element isolation region on a substrate, grooves are provided beforehand and an insulating film is formed by e.g., CVD such that this groove is filled. Subsequently, the insulating film surface is planarized by CMP, and thereby the element isolation region is formed. In order to correspond to narrowing of the element isolation region, when shallow trench isolation (STI) is adopted, it is required to remove unnecessary part of the insulating film formed on the substrate.

In these processes, the introduction of slurry that contains a cerium compound such as cerium oxide and cerium hydroxide as abrasive grain has been proceeded. This slurry not only is capable of high-speed polishing of insulating films but also is capable of reducing defects that are generated on the surface upon polishing called scratches as compared with conventional silica slurry. It is also an advantage of this slurry that it has a high selectivity in polishing against silicon nitride film that is used as a stop film.

The substrate surface after CMP is contaminated by particles represented by alumina, silica or cerium oxide particles, or by metallic impurities originated from constitutive materials of the polished substrate of from chemical agents included in the slurry. These contaminants need to be completely removed before entering into the next step because they would cause a pattern defect or adhesion failure or failures in electric properties. As a general post-CMP cleaning to remove these contaminants, brush-cleaning is performed in which the chemical effect by the cleaning solution and the physical effect by e.g., sponge brush made of polyvinyl alcohol are used in combination.

Various post-CMP cleaning solutions have been proposed depending on the contaminant to be removed. Each of these cleaning solutions is used either alone or in combination, according to the purpose.

Patent Reference 1 proposes a cleaning solution based on hydrofluoric acid-ammonium salt system as an acidic cleaning solution to be used for a substrate on which cerium oxide is attached. However, in order to obtain sufficient cleaning performance, it is necessary to use high concentration of hydrofluoric acid or to take a long treatment time, which would not only remove the contaminant but might also cause etching of $SiO_2$, $Si_3N_4$ and Si, etc. that constitute layers of the substrate surface, adding damage to the substrate. Moreover, hydrofluoric acid is highly toxic and therefore has a safety issue such as a need for an intensive caution at work.

Patent Reference 2 proposes a cleaning solution based on strong acid-water system such as sulfuric acid as an acidic cleaning solution to clean device for suppling cerium oxide-containing slurry. However, the cleaning using a cleaning solution containing sulfuric acid is generally carried out under high-temperature condition (120-150° C.), which corrodes cleaning device members, and might preclude the application of brush-scrub cleaning that is ancillary to CMP device. Therefore, it may cause problems of equipment such as that a batch cleaning device and single wafer cleaning device must be used separately.

Patent Reference 3 proposes a cleaning solution based on ammonia-hydrogen peroxide solution-water system as an alkaline cleaning solution. However, it is not only necessary to take a long treatment time in order to obtain sufficient cleaning performance using this cleaning solution, but it may also cause a problem in working environment because it is accompanied by a strong offensive odor from ammonia gas generation.

Patent Reference 4 proposes a cleaning chemical solution comprising three ingredients; an acid, a reducing agent and fluorine ion, for cleaning the surface of glass material after polishing it using a cerium oxide-containing abrasive. The concentration of fluorine ion in the chemical solution is substantially limited to be within a very low range due to the risk of generating a latent flaw to glass material. Moreover, there is neither any disclosure nor suggestion of embodiments comprising use of a surfactant. Therefore, it is predicted that the effect of cleaning by this chemical solution is limited.

PRIOR ART REFERENCES

Patent References

[Patent Reference 1] JP A 2012-164713
[Patent Reference 2] JP A 2012-134357
[Patent Reference 3] JP A 2004-292792
[Patent Reference 4] JP A 2004-59419

SUMMARY OF INVENTION

Problems to be Solved by the Invention

Accordingly, the object of the present invention is to provide a cleaning solution composition which causes no damage to silicon oxide ($SiO_2$) (e.g., TEOS, etc.), silicon nitride ($Si_3N_4$) and silicon (Si), etc. which constitute the substrate surface layer during the cleaning of the semiconductor substrate or glass substrate surface, and which can be used under treatment conditions that are applicable to the brush-scrub cleaning chamber that is ancillary to a CMP device (treatment temperature: around room temperature, treatment time: within a few minutes, no erosion to device members), and which has a high removal performance against compounds originated from abrasive grains in the slurry, in particular, cerium compounds such as cerium oxides and cerium hydroxides.

Means to Solve the Problems

The present inventors made an intensive investigation for the purpose of solving the above-described problems and found that a cleaning solution composition for cleaning a semiconductor substrate or glass substrate surface comprising one or more inorganic acids that contain fluorine atoms within their structure or salts thereof, water, one or more reducing agent, and one or more anionic surfactants and having hydrogen ion concentration (pH) of less than 7 causes no damage to the substrate, can be used under treatment conditions applicable to a brush-scrub cleaning chamber that is ancillary to a CMP device, and has a high removal performance against compounds originated from abrasive grains in the slurry, in particular, cerium compounds such as cerium oxides and cerium hydroxides. The inventors further proceeded the investigation and reached the completion of the invention.

Namely, the present invention relates to the followings:
<1> A cleaning solution composition for cleaning a semiconductor substrate or glass substrate surface, comprising one or more inorganic acids that contain fluorine atoms within their structure or salts thereof, water, one or more reducing agent, and one or more anionic surfactants, and having hydrogen ion concentration (pH) of less than 7.
<2> The cleaning solution composition according to <1>, wherein the inorganic acid that contains fluorine atoms within its structure is hydrofluoric acid, hexafluorosilicic acid or hexafluoroboric acid or combinations thereof.
<3> The cleaning solution composition according to <1>, wherein the salt of the inorganic acid that contains fluorine atoms is an ammonium salt, amine salt or quaternary ammonium salt or combination thereof.
<4> The cleaning solution composition according to any one of <1> to <3>, wherein the reducing agent is selected from a group consisting of five- or six-membered cyclic compounds having two or more hydroxyl groups.
<5> The cleaning solution composition according to <4>, wherein five- or six-membered cyclic compound having two or more hydroxyl groups is ascorbic acid, catechol, resorcinol, hydroquinone, pyrogallol or methylcatechol.
<6> The cleaning solution composition according to any one of <1> to <5>, wherein the anionic surfactant is a condensate of naphthalenesulfonic acid and formaldehyde or a salt thereof.
<7> The cleaning solution composition according to any one of <1> to <6> for cleaning residual cerium compound on a semiconductor substrate or glass substrate surface after performing chemical machine polishing (CMP) of the semiconductor substrate or glass substrate surface using slurry containing a cerium compound as abrasive grain.
<8> A stock solution composition for the cleaning solution composition according to any one of <1> to <7> for use in producing the cleaning solution composition by being diluted by from 10-fold to 1000-fold.
<9> A method of manufacturing a electronic device comprising steps of performing chemical machine polishing (CMP) of a semiconductor substrate or glass substrate surface using a slurry containing a cerium compound as abrasive grain, and then cleaning residual cerium compound on the semiconductor substrate or glass substrate surface using the cleaning solution composition according to any one of <1> to <7>.

Moreover, the embodiment for reference regarding the present invention relates to the followings:
[1] A cleaning solution composition for cleaning a semiconductor substrate or glass substrate surface, comprising one or more inorganic acids that contain fluorine atoms within the structure (provided that hydrofluoric acid is excluded) or salts thereof and water, and having hydrogen ion concentration (pH) of less than 7.
[2] The cleaning solution composition according to [1], wherein the inorganic acid that contains fluorine atoms within its structure is hexafluorosilicic acid or hexafluoroboric acid or combinations thereof.
[3] The cleaning solution composition according to [1] or [2], comprising one or more surfactants.
[4] The cleaning solution composition according to [3], wherein the surfactant is a condensate of naphthalenesulfonic acid and formaldehyde or a salt thereof.
[5] The cleaning solution composition according to any one of [1] to [4], having hydrogen ion concentration (pH) of less than 3.
[6] The cleaning solution composition according to any one of [1] to [5], comprising one or more peroxides.
[7] The cleaning solution composition according to [6], wherein the peroxide is hydrogen peroxide.
[8] The cleaning solution composition according to any one of [1] to [7] for cleaning residual cerium compound on a semiconductor substrate or glass substrate surface after performing chemical machine polishing (CMP) of the semiconductor substrate or glass substrate surface using slurry containing a cerium compound as abrasive grain.
[9] A stock solution composition for the cleaning solution composition according to any one of [1] to [8] for use in producing the cleaning solution composition by being diluted by from 10-fold to 1000-fold.
[10] A method of manufacturing a electronic device comprising steps of performing chemical machine polishing (CMP) of a semiconductor substrate or glass substrate surface using slurry containing a cerium compound as abrasive grain, and then cleaning residual cerium compound on the semiconductor substrate or glass substrate surface using the cleaning solution composition according to any one of [1] to [8].

Effects of the Invention

The cleaning solution composition of the present invention causes no damage to $SiO_2$, $Si_3N_4$ and Si, etc. which constitute the substrate surface layer during the cleaning of semiconductor substrate or glass substrate surface in the processes for manufacturing electrical devices such as a semiconductor element, can be used under treatment conditions applicable to a brush-scrub cleaning chamber that is ancillary to a CMP device (treatment temperature: around room temperature, treatment time: within a few minutes, no erosion to device members), and can increase the removal performance against compounds originated from abrasive grains in a slurry.

BRIEF DESCRIPTION OF DRAWINGS

FIG. 1 is a diagram showing pH-potential of a cerium (Ce)-water system.

FIG. 2 is a diagram showing pH-dependency of the for each of cerium oxide ($CeO_2$) and silicon oxide ($SiO_2$).

FIG. 3 is a diagram showing the relationship between the reducing agent species contained in the solution for measuring reduction potential and the reduction potential.

FIG. 4 is a diagram showing the relationship between acid species and reducing agent species contained or their presence or absence in the cleaning solution composition, and the cleaning performance.

FIG. 5 is a diagram showing the relationship between acid species, reducing agent species, contained or their presence or absence in the cleaning solution composition and the presence or absence of the anionic surfactant, and the etching rate for TEOS wafer.

FIG. 6 is a diagram showing the relationship between acid species, reducing agent species, contained or their presence or absence in the cleaning solution composition and the presence or absence of the anionic surfactant, and the solubility of the abrasive grain.

FIG. 7 is a diagram showing the relationship between acid species, reducing agent species, contained or their presence or absence in the cleaning solution composition and the presence or absence of the anionic surfactant, and the zeta-potential for each particle of $CeO_2$, $SiO_2$ and $Si_3N_4$.

FIG. 8 is a diagram showing the relationship between acid species, reducing agent species, contained or their presence or absence in the cleaning solution composition and the presence or absence of the anionic surfactant, and cleaning performance for each wafer of TEOS and $Si_3N_4$.

FIG. 9 is a diagram showing the relationship between acid species and reducing agent species contained in the cleaning solution composition and the presence or absence of the anionic surfactant, and cleaning performance for TEOS wafer.

FIG. 10 is a diagram showing the relationship between acid species contained in the cleaning solution composition and the presence or absence of hydrogen peroxide ($H_2O_2$), and the amount of dissolved cerium oxide.

FIG. 11 is a diagram showing the relationship between pH of the cleaning solution composition and the presence or absence of hydrogen peroxide ($H_2O_2$), and the amount of dissolved cerium oxide.

FIG. 12 is a diagram showing the relationship between acid species contained in the cleaning solution composition and the presence or absence of the surfactant, and the zeta-potential of cerium oxide.

FIG. 13 is a diagram showing the relationship between acid species contained in the cleaning solution composition and the presence or absence of the surfactant, and the zeta-potential of silicon oxide.

FIG. 14 is a diagram showing the relationship between acid species contained in the cleaning solution composition and the presence or absence of the surfactant, and the zeta-potential of silicon nitride.

FIG. 15 is a diagram showing the relationship between acid species contained in the cleaning solution composition and the presence or absence of the surfactant, and the zeta-potential of silicon.

FIG. 16 is a diagram showing the relationship between pH of the cleaning solution composition and the presence or absence of the surfactant, and the zeta-potential of cerium oxide.

FIG. 17 is a diagram showing AFM three-dimensional images of silicon oxide wafer surfaces (a) before immersing into the cleaning solution composition, (b) after immersing into the cleaning solution composition containing a surfactant, and (c) after immersing into the cleaning solution composition containing both surfactant and hydrogen peroxide ($H_2O_2$).

FIG. 18 is a diagram showing AFM three-dimensional images of silicon nitride wafer surfaces (a) before immersing into the cleaning solution composition, (b) after immersing into the cleaning solution composition containing a surfactant, and (c) after immersing into the cleaning solution composition containing both surfactant and hydrogen peroxide ($H_2O_2$).

DESCRIPTION OF EMBODIMENTS

Hereinbelow, the present invention will be explained in detail based on suitable embodiments of the present invention.

First, the cleaning solution composition of the present invention is to be explained.

The cleaning solution composition of the present invention is a cleaning solution composition for cleaning a semiconductor substrate or glass substrate surface, comprising one or more inorganic acids that contain fluorine atoms within their structure or salts thereof, water, one or more reducing agent, and one or more anionic surfactants, and having hydrogen ion concentration (pH) of less than 7.

The inorganic acid that contains fluorine atoms within its structure or a salt thereof used in the cleaning solution composition of the present invention mainly has an effect of separating the residual compounds on the substrate surface that are originated from abrasive grains in the slurry from the substrate surface and dissolving them in the cleaning solution composition.

A cleaning solution composition which does not comprise said inorganic acid that contains fluorine atoms within its structure or a salt thereof might have an insufficient ability to clean the substrate surface because it has poor ability to dissolve the compounds originated from abrasive grains in the slurry. Moreover, the cleaning solution composition comprising hydrofluoric acid has not only an insufficient cleaning performance, but it might also cause safety issues due to high toxicity of hydrofluoric acid.

The inorganic acid that contains fluorine atoms within its structure or a salt thereof that can be used in the cleaning solution composition of the present invention is not particularly limited, though hydrofluoric acid, hexafluorosilicic acid or hexafluoroboric acid or a salt thereof can preferably be used. The salt which is preferably used is an ammonium salt, an amine salt or a quaternary ammonium salt, etc. These acids and salts may be used alone or in combination.

The content of said inorganic acid that contains fluorine atoms within its structure or a salt thereof in the cleaning solution composition of the present invention is not particularly limited, though it is preferred to be between 5 and 100 mM, and more preferably between 20 and 50 mM.

The reducing agents which can be used in the cleaning solution composition of the present invention include, but not particularly limited to, e.g., five- or six-membered cyclic compound having two or more hydroxyl groups, reducing sugars such as glucose or fructose. Among these, a five- or six-membered cyclic compound having two or more hydroxyl groups is preferably used. These reducing agent may be used alone or in combination.

The five- or six-membered ring that constitutes the compound having two or more hydroxyl groups may be a saturated or unsaturated five- or six-membered ring, or may be an aromatic five- or six-membered ring. Furthermore, said five- or six-membered ring may be constituted solely by carbon atoms, or it may be constituted by carbon atoms and heteroatoms (nitrogen atoms, oxygen atoms, sulfur atoms, etc.). For example, a reducing agent which is a six-membered cyclic compound having two or more hydroxyl groups, in particular an aromatic six-membered cyclic compound having two or more hydroxyl groups is preferably used in the present invention.

The reducing agent which may be used in the cleaning solution composition of the present invention is more preferably a five- or six-membered cyclic compound having two or more hydroxyl groups, particularly preferably ascorbic acid, gallic acid, catechol, resorcinol, hydroquinone, pyrogallol or methylcatechol, and very preferably catechol, resorcinol, hydroquinone, pyrogallol or 4-methylcatechol.

The reducing agent which may be used in the cleaning solution composition of the present invention can appropriately be selected according to the condition of the semiconductor substrate or glass substrate surface to be cleaned and the embodiment of cleaning, etc. For example, reduction power strength can be comprehended by measuring the reduction potential of the reducing agent and the reducing agent can appropriately be selected according to the desired embodiment of cleaning.

The content of the reducing agent is not particularly limited, though it is preferably between 0.01 and 500 mM, more preferably between 0.1 and 50 mM.

The anionic surfactant which can be used in the cleaning solution composition of the present invention is not particularly limited, though a condensate of naphthalenesulfonic acid and formaldehyde or a salt thereof is preferably used.

The content of the anionic surfactant in the cleaning solution composition of the present invention is not particularly limited, though it is preferably between 5 and 1000 ppm, more preferably between 50 and 100 ppm.

The pH of the cleaning solution composition of the present invention is less than 7, preferably less than 3. In such pH region, compounds originated from the abrasive grains in the slurry tend to show high solubility to the cleaning solution composition of the present invention, which is convenient for dissolving said compounds in the cleaning solution composition for removal.

For example, when said compounds are to be removed by using slurry comprising cerium (Ce) compounds such as cerium oxide and cerium hydroxide as abrasive grain, the pH-potential diagram of cerium-water system needs to be taken into account (FIG. 1). In cerium-water system, a cerium compound is likely to be solid in high pH region (alkaline region) and likely to be ionized in low pH region (acidic region). It can therefore be understood that the solution is preferably in low pH region in order to dissolve and remove the cerium compound.

There is no particular lower limit of the pH of the cleaning solution composition of the present invention, though it is preferably at 1.0 or higher, more preferably at 1.5 or higher.

To adjust the pH of the cleaning solution composition of the present invention, any acid and alkali other than the aforementioned inorganic acids that contain fluorine atoms within their structure may be used As an embodiment of the cleaning solution composition of the present invention, an embodiment in which a hydrofluoric acid is contained as the inorganic acid that contains fluorine atoms within its structure is exemplified. As another embodiment, an embodiment in which no hydrofluoric acid is contained as the inorganic acid that contains fluorine atoms within its structure.

Preferably, the cleaning solution composition of the present invention does not comprise hydrogen peroxide, in particular, hydrogen peroxide solution.

The reason for which the cleaning solution composition of the present invention exhibits an excellent removal performance against compounds originated from the abrasive grains in slurry is not clear, though it appeared to be for following reasons.

It is considered that, when chemical machine polishing (CMP) was performed on a substrate surface (a surface of a semiconductor substrate, glass substrate, etc.) using slurry containing a cerium compound as abrasive grain, there are not only cerium compound but also a reactant in which the cerium compound and the substrate form Ce—O—Si bond (hereinbelow referred to as "cerium-substrate reactant") remaining on the substrate surface. Particularly, it is extremely difficult to remove the cerium-substrate reactant because it forms a chemical bond with the substrate.

By applying the cleaning solution composition of the present invention to the substrate surface after chemical machine polishing, a reducing agent contained in the cleaning solution composition alters the valency of cerium which exists on the cerium-substrate reactant surface from $Ce^{4+}$ to $Ce^{3+}$, which will either cleave or weaken the Ce—O—Si bond formed by the cerium-substrate reactant. Bringing this into a reaction with the inorganic acid that contains fluorine atoms within its structure contained in the cleaning solution composition will completely cleave the Ce—O—Si bond formed by the cerium-substrate reactant. Moreover, because the aforementioned inorganic acid functions as a complexing agent, it is considered to form a complex with the cerium-substrate reactant in which the Ce—O—Si bond has been cleaved, facilitating its dissolution into the cleaning solution composition and separation from the substrate surface.

For the cerium compound used as abrasive grain, it is similarly considered that cerium in the cerium compound is reduced to $Ce^{3+}$ by the reducing agent, which improves its solubility into the cleaning solution composition, resulting in an improvement of cleaning performance.

Furthermore, the surfactant contained in the cleaning solution composition of the present invention covers the surface of the compounds originated from the abrasive grains in slurry to form particles surrounded by the surfactant. This causes said particles and the substrate surface to have the same sign to each other, which generates a repulsive force therebetween, facilitating the separation of the particles from the substrate surface and improving cleaning performance of the cleaning solution composition.

For example, when a substrate in which the surface layer is made of silicon oxide is polished using slurry comprising cerium oxide as abrasive grain, in order to remove abrasive grains, it is necessary to take the zeta-potential of cerium oxide ($CeO_2$) and silicon oxide ($SiO_2$) into account (FIG. 2). In this system, in a region where pH is about 1.5 or higher and less than about 6, the zeta-potential of the cerium oxide compound which constitutes the abrasive grain is +(plus), whereas the zeta-potential of the substrate surface constituted by silicon oxide is −(minus), then their zeta-potential have opposite signs, generating an attractive force between the cerium oxide compound which constitutes the abrasive grain and the substrate surface. In such case, the use of a surfactant, which is appeared to reverse the sign of the zeta-potential of the cerium oxide compound, is considered to be effective for removing the cerium oxide compound from the substrate surface. Furthermore, in pH region in which the signs of the zeta-potential of the cerium oxide compound which constitutes the abrasive grain and the substrate surface constituted by silicon oxide are the same, surfactants appear to have an effect of increasing absolute value of the zeta-potential for both substrate surface and cerium oxide compound, and thus considered to be effective for removing the cerium oxide compound from the substrate surface.

Abrasive grains to be removed by the cleaning solution composition of the present invention, i.e., abrasive grains used for polishing a semiconductor substrate or glass substrate are not particularly limited, though silicon compounds such as silicon oxide ($SiO_2$; also referred to as silica) as well as cerium compounds such as cerium oxide ($CeO_2$; also referred to as ceria) and cerium hydroxide ($Ce(OH)_4$) are preferred. Among these, cerium compounds such as cerium hydroxide and cerium oxide are preferred, and cerium oxide is further preferred, because these compounds are unlikely to cause scratches on substrate upon polishing, are expected to have high planarity of the substrate after polishing, has a high polishing rate, and has a high selectivity such that the excess silicon oxide is polished but not silicon nitride.

Layers that constitute the semiconductor substrate surface to be cleaned by the cleaning solution composition of the present invention is not particularly limited, though they may include, e.g., silicon oxide, silicon nitride and silicon as well as combinations thereof. Similarly, the glass substrate to be cleaned by the cleaning solution composition of the present invention is not particularly limited.

One preferred embodiment of the present invention is a cleaning solution composition for cleaning residual cerium compound on a semiconductor substrate or glass substrate surface after performing chemical machine polishing (CMP) of such surface using slurry containing a cerium compound as abrasive grain. The semiconductor substrate is, for example, a semiconductor substrate for the manufacture of a semiconductor element, and the glass substrate is, for example, a glass substrate for the manufacture of a hard-disk or flat panel display.

Ingredients contained in the cleaning solution composition in this embodiment and their preferred embodiments are similar to the ingredients contained in the cleaning solution composition of the present invention and their preferred embodiments.

Moreover, the present invention relates to a stock solution composition for a cleaning solution composition of the present invention for use in producing the cleaning solution composition by being diluted by from 10-fold to 1000-fold.

The stock solution composition of the present invention can produce the cleaning solution composition of the present invention by being diluted. The cleaning solution composition of the present invention can be obtained by diluting the stock solution composition of the present invention by, e.g., 10-fold or more, preferably from 10 to 1000-fold, more preferably from 50 to 200-fold, though the degree of dilution is appropriately determined according to the constituted composition and not limited to this.

Furthermore, the present invention relates to a method of manufacturing a electronic device, comprising steps of performing chemical machine polishing (CMP) of a semiconductor substrate or glass substrate surface using slurry containing a cerium compound as abrasive grain, and then cleaning the residual cerium compound on the semiconductor substrate or glass substrate surface using the cleaning solution composition of the present invention.

According to the method of manufacturing a electronic device of the present invention, the residues of compounds originated from abrasive grains in slurry used in chemical machine polishing can be suppressed at a very low level, which enables the production of a high-performance device at a high yield.

EXAMPLES

With reference to the cleaning solution composition of the present invention, the present invention will be explained in more detail by Working Examples and Comparative Examples as well as Reference Examples and Reference Comparative Examples described below, though the present invention is not limited thereto.

In Working Examples and Comparative Examples as well as Reference Examples and Reference Comparative Examples of cleaning solution compositions indicated in each table, the content (mM) indicates the content (concentration) in the cleaning solution composition in each Working Example and Comparative Example as well as Reference Example and Reference Comparative Example. Unless being described otherwise, cleaning solution compositions are obtained by dissolving the ingredients indicated in tables in water (ultrapure water (DIW)) and subsequently adding methansulfonic acid (KANTO CHEMICAL CO., INC.) for pH adjustment. Moreover, unless being described otherwise, the "anionic surfactant" and "surfactant" described in each table is a condensate of naphthalenesulfonic acid and formaldehyde (Sanyo Chemical Industries, Ltd.).

Working Examples 1-11, Comparative Examples 1-9

<Assessment A: Reduction Power of Reducing Agent (Measurement of Reduction Potential)>
(Production of Ceria Substrate)

On a silicon substrate of 200 mm in diameter, a ceria ($CeO_2$) film of 50 nm thick is formed by vapor deposition method to give a ceria substrate.
(Production of a Solution for Measuring Reduction Potential)

Each solution for measuring reduction potential was prepared by adding a reducing agent to an aqueous solution of hydrogen chloride (10 mM; pH=2). Besides, an aqueous solution of hydrogen chloride to which no reducing agent was added was taken as reference solution for measuring reduction potential.
(Measurement of Reduction Potential)

The above-described ceria substrate was immersed in the solution for measuring reduction potential, and the reduction potential was measured for each solution using a potentiogalvanostat (Solartron Analytical, Model number: S11287). The lower the measured reduction potential is, the stronger the reduction power of the reducing agent is assessed to be.

Table 1 and FIG. 3 show the compositions of solutions for measuring reduction potential and and the results.

TABLE 1

| Solution for measuring reduction potential | Reducing agent | Conc. (mM) | pH | Reduction potential [V vs. AgAgCl] |
|---|---|---|---|---|
| (Reference) | None | — | 2 | 0.50 |
| 1 | Oxalic acid | 5 | 2 | 0.50 |
| 2 | Resorcinol | 5 | 2 | 0.46 |
| 3 | Catechol | 5 | 2 | 0.38 |
| 4 | Methylcatechol | 5 | 2 | 0.31 |
| 5 | Pyrogallol | 5 | 2 | 0.26 |
| 6 | Ascorbic acid | 5 | 2 | 0.21 |

From measurement results, among the reducing agents used in measurement, the reduction power of ascorbic acid was assessed to be the strongest and that of oxalic acid was assessed to be the weakest.

<Assessment B: Cleaning Performance (Ce Surface Concentration) of Cleaning Solution Composition>
(Preparation of CMP Polishing Solution)

Cerium oxide slurry having average particle diameter of 0.1 μm (Slurry P, Hitachi Chemical Co., Ltd.) was diluted by 10-fold to give a CMP polishing solution.
(Production of Wafer to be Polished)

On a silicon substrate of 200 mm in diameter, a TEOS ($Si(OC_2H_5)_4$) wafer of 1000 nm thick was produced by plasma CVD method.
(Wafer Polishing)

Using the above-described CMP polishing solution, the above-described wafer to be polished was polished for 30 sec with a polishing device (CMP polishing device from MAT, Model number: ARW-681MSII). After finishing the polishing, the wafer was rinsed for 10 sec using 100 mL of ultrapure water (DIW) with rotating. Using cleaning solution compositions having the compositions of Table 2, the wafer was cleaned for predetermined time by rolling a brush made of polyvinylalcohol (SOFU ENGINEERING) over the rinsed wafer while rotating the wafer. The cleaned wafer was rinsed for 30 sec using 300 mL of ultrapure water (DIW) while rotating the wafer, and dried at 25° C. for 30 sec while further rotating to give a wafer for measurement.
(Measuring Ce Concentration of Wafer Surface)

The Ce concentration of the surface of the above-described wafer for measurement was measured by TXRF (total reflection fluorescent X-ray analyzer) (Rigaku Corporation, Model number: 3800e), the cleaning performance of the cleaning solution composition was assessed. Ce concentration was assessed by the number of Ce atoms per 1 $cm^2$ of wafer surface. Results corresponding to each cleaning solution composition and cleaning time are shown in Table 2 and FIG. 4.

The obtained results suggest that the lower the reduction potential of the reducing agent is, namely, the stronger the reduction power of the reducing agent is, the higher the cleaning performance is.

TABLE 2

| | Acid | | Reducing agent | | Surfactant (ppm) | pH | Cleaning time (sec) | Ce surface conc. ($\times 10^{10}$ atoms/$cm^2$) |
|---|---|---|---|---|---|---|---|---|
| | | Conc. (mM) | | Conc. (mM) | | | | |
| Comparative Example 1 | Hexafluorosilicic acid | 30 | None | — | 100 | 2 | 40 | 21 |
| Working Example 1 | Hexafluorosilicic acid | 30 | Resorcinol | 5 | 100 | 2 | 40 | 16.2 |
| Working Example 2 | Hexafluorosilicic acid | 30 | Catechol | 5 | 100 | 2 | 40 | 4.3 |
| Working Example 3 | Ammonium fluoride | 20 | Methylcatechol | 5 | 100 | 2 | 40 | 1.3 |
| Working Example 4 | Ammonium fluoride | 20 | Pyrogallol | 5 | 100 | 2 | 40 | 1 |
| Working Example 5 | Ammonium fluoride | 20 | Ascorbic acid | 5 | 100 | 2 | 40 | 0 |

<Assessment C: Damaging Property (Etching Rate) of Cleaning Solution Composition>

(Production of Wafer (Pre-Immersion))

On a silicon substrate of 200 mm in diameter, TEOS ($Si(OC_2H_5)_4$) wafer (pre-immersion) of 1000 nm thick was produced by plasma CVD method.

(Immersing Wafer in Cleaning Solution Composition)

The above-described TEOS wafer (pre-immersion) was immersed in 100 mL of cleaning solution compositions having compositions of Table 3, left for 5 min at room temperature. The wafer was then removed, rinsed for 1 min using 5000 mL of ultrapure water (DIW) to give TEOS wafer (post-immersion).

TABLE 3

| | Acid | | Reducing agent | | | |
|---|---|---|---|---|---|---|
| | | Conc. (mM) | | Conc. (mM) | Surfactant (ppm) | pH |
| Comparative Example 2 | Hexafluorosilicic acid | 30 | None | — | 100 | 2 |
| Comparative Example 3 | Ammonium fluoride | 75 | None | — | 100 | 2 |
| Working Example 6 | Hexafluorosilicic acid | 30 | Ascorbic acid | 5 | 100 | 2 |
| Working Example 7 | Ammonium fluoride | 20 | Pyrogallol | 5 | 100 | 2 |
| Comparative Example 4 | Hydrofluoric acid | 500 | None | — | None | 3 |

(Measuring Etching Rate of Cleaning Solution Composition)

The film thickness of the above-described TEOS wafer (pre-immersion) was measured with a reflection spectroscopy thickness monitor (OTSUKA ELECTRONICS Co., Ltd., Model number: FE-3000) and thickness of the above-described TEOS wafer (post-immersion) was measured with a reflection spectroscopy thickness monitor (OTSUKA ELECTRONICS Co., Ltd., Model number: FE-3000), and etching rate (E.R.) of the cleaning solution composition for TEOS was calculated from the difference between before and after immersion.

Table 4 and FIG. 5 show the results.

<Assessment D: Solubility of Abrasive Grains ($CeO_2$ Particles) in Cleaning Solution Composition>

In 50 g of the cleaning solution compositions having the compositions of Table 3, 0.1 g of cerium oxide (average particle diameter 10 μm; KANTO CHEMICAL CO., INC.) was immersed and left for 30 min at room temperature. After filtering the solid off, cerium concentration in the filtrate was analyzed with ICP-AES (inductively coupled plasma atomic emission spectrophotometer) (Agilent Technologies, Inc., Model number: Agilent720).

Table 4 and FIG. 6 show the results.

<Assessment E: Measuring Zeta-Potential of Each of $CeO_2$, $SiO_2$ and $Si_3N_4$ Particles in Cleaning Solution Composition>

Cerium oxide spheroidal powder (0.05 g) having average particle diameter of 0.6 μm was mixed with 20 mL of ultrapure water, stirred for 10 min using an ultrasonic device to an uniform dispersion, and then 0.05 mL of this solution was taken and added to 20 mL of the cleaning solution compositions having the compositions of Table 3. These solution was further stirred to uniformity, and the zeta-potential of cerium oxide was measured with a zeta-potential measuring device (OTSUKA ELECTRONICS Co., Ltd., Model number: ELS-Z2).

For each of silicon oxide and silicon nitride particles, the zeta-potential (mV) was measured in a similar way to that for cerium oxide.

Table 4 and FIG. 7 show the results.

<Assessment F: Cleaning Performance (Ce Surface Concentration) of Cleaning Solution Composition>

(Production of an Object Wafer for Polishing)

On a silicon substrate of 200 mm in diameter, a TEOS film of 1000 nm thick or $Si_3N_4$ film of 100 nm thick was produced by plasma CVD method to give a wafer to be polished.

(Polishing of Wafer and Measurement of Ce Concentration of Wafer Surface)

For Working Examples 6 and 7 as well as Comparative Examples 2 and 3, wafer was polished and Ce concentration of the wafer surface was measured as mentioned in the above-described Assessment B using the cleaning solution compositions having the compositions of Table 3. Besides, cleaning time in the cleaning step was 40 seconds.

For Comparative Example 4, wafer was polished and Ce concentration of the wafer surface was measured in a similar way to that for Working Examples 6 and 7 as well as Comparative Examples 2 and 3, except that the wafer was cleaned for 10 sec using the cleaning solution compositions having the compositions of Table 3 and then cleaned for 30 sec using an aqueous solution comprising 0.3M $NH_4OH$ and 1.4M $H_2O_2$ (SC-1) in cleaning steps.

Table 4 and FIG. 8 show the results.

TABLE 4

| | Etching rate, TEOS wafer (Å, 40 sec) | Ce conc. (ppm/sec) | Zeta potential (mV) | | | Ce surface conc. ($\times 10^{10}$ atoms/cm$^2$) | |
|---|---|---|---|---|---|---|---|
| | | | $CeO_2$ particle | $SiO_2$ particles | $Si_3N_4$ particles | TEOS wafer | $Si_3N_4$ wafer |
| Comparative Example 2 | 0.7 | 0.3 | −87.4 | −21.2 | −72.5 | 25.4 | 5.6 |
| Comparative Example 3 | 14.5 | 2.5 | −144.9 | −114.1 | −174.3 | 6.9 | 2.6 |
| Working Example 6 | 1.1 | 0.1 | −110 | −18.8 | −90.4 | 2.3 | 2.0 |

TABLE 4-continued

|  | Etching rate, TEOS wafer (Å, 40 sec) | Ce conc. (ppm/sec) | Zeta potential (mV) | | | Ce surface conc. ($\times 10^{10}$ atoms/cm$^2$) | |
|---|---|---|---|---|---|---|---|
|  |  |  | CeO$_2$ particle | SiO$_2$ particles | Si$_3$N$_4$ particles | TEOS wafer | Si$_3$N$_4$ wafer |
| Working Example 7 | 3.2 | 0.1 | −135.9 | −62.35 | −181.7 | 0.84 | 1.1 |
| Comparative Example 4 | 46.3 | 6.4 | −31.3 | −22.6 | −28.4 | 2.4 | 11.1 |

As shown in Table 4 and FIGS. 5-8, the cleaning solution compositions of Working Examples 6 and 7 had better cleaning performance as compared to those of Comparative Examples 3 and 4, regardless of lower solubility of abrasive grains (CeO$_2$ particles) and lower etching rate for TEOS wafer. This suggests that in the cleaning solution composition of the present invention, not only the solubility of the abrasive grains and slight etching effect by the substrate contribute to the cleaning performance, but the effect of the reducing agent which weakens Ce—O—Si bond formed between the wafer and abrasive grains as well as synergistic effects by the inorganic acid that contains fluorine atoms within its structure or a salt thereof and by the anionic surfactant also remarkably improve the cleaning performance.

Moreover, the cleaning solution composition of Comparative Example 2 exhibited a lower solubility of the abrasive grains and lower etching rate for TEOS wafer and inferior cleaning performance.

Furthermore, the cleaning performance of the cleaning solution compositions of Working Examples 8-11 and Comparative Examples 5-9 for TEOS wafer was assessed by a similar procedure to that in the above-described Assessment F.

Compositions and results of the cleaning solution compositions are shown in Table 5 and FIG. 9.

As is clear from the results above, the cleaning solution composition of the present invention results in further improvement of the cleaning performance based on a new cleaning procedure which weakens Ce—O—Si bond formed between the wafer and abrasive grains by combination of an inorganic acid that contains fluorine atoms within its structure or a salt thereof and anionic surfactant with a reducing agent.

Reference Examples 1-6, Reference Comparative Examples 1-5

<Assessment 1: Solubility to Cleaning Solution Composition (Acid-Dependency) of Abrasive Grains (CeO$_2$ Particles)>

In 50 g of the cleaning solution composition, 0.5 g of cerium oxide (average particle diameter 10 μm; KANTO CHEMICAL CO., INC.) was immersed and left for 30 min at room temperature. After filtering the solid off, the cerium concentration in the filtrate was analyzed with ICP-MS (inductively coupled plasma mass spectrometer) (Agilent Technologies, Inc., Model number: 7500cs). Table 6 and FIG. 10 show the compositions and results of the cleaning solution compositions.

TABLE 5

|  | Acid | | Reducing agent | | Surfactant | | Ce surface conc. TEOS wafer |
|---|---|---|---|---|---|---|---|
|  |  | Conc. (mM) |  | Conc. (mM) |  | (ppm) |  |
| Working Example 8 | Hexafluorosilicic acid | 30 | Ascorbic acid | 5 | 100 | 2 | 2.3 |
| Working Example 9 | Ammonium fluoride | 20 | Pyrogallol | 5 | 100 | 2 | 0.84 |
| Working Example 10 | Hydrofluoric acid | 20 | Ascorbic acid | 5 | 100 | 2 | 0.9 |
| Working Example 11 | Hydrofluoric acid | 20 | Pyrogallol | 5 | 100 | 2 | 0.9 |
| Comparative Example 5 | Ammonium fluoride | 20 | Pyrogallol | 5 | None | 2 | 8.6 |
| Comparative Example 6 | Hydrochloric acid | 10 | Ascorbic acid | 5 | 100 | 2 | 67.2 |
| Comparative Example 7 | Sulfuric acid | 10 | Ascorbic acid | 5 | 100 | 2 | 174 |
| Comparative Example 8 | Hydrochloric acid | 10 | Ascorbic acid | 5 | None | 2 | 98.7 |
| Comparative Example 9 | Sulfuric acid | 10 | Ascorbic acid | 5 | None | 2 | 140 |

As shown in Table 5 and FIG. 9, the cleaning solution compositions of the present invention exhibit good cleaning performance, whereas the cleaning solution composition of Comparative Example 5 which contains no anionic surfactant as well as the cleaning solution compositions of Comparative Examples 6-9 which contain neither of the inorganic acid that contains fluorine atoms within its structure or a salt thereof and/or anionic surfactant had inferior cleaning performance.

TABLE 6

|  |  | Ce Conc. (ppb) | |
|---|---|---|---|
| Acid | Conc. (mM) | No H$_2$O$_2$ | +H$_2$O$_2$ (50 mM) |
| Citric acid | 50 | 84.67 | 350.2 |
| Malonic acid | 50 | 164.9 | 115.8 |
| Glutaric acid | 50 | 28.53 | 240.8 |
| HNO$_3$ | 50 | 120.4 | 4147 |

TABLE 6-continued

| Acid | Conc. (mM) | Ce Conc. (ppb) | |
|---|---|---|---|
| | | No $H_2O_2$ | +$H_2O_2$ (50 mM) |
| $H_2SO_3$ | 50 | 234.9 | 4741 |
| $MeSO_3H$ | 50 | 83.73 | 3007 |
| $H_2SiF_6$ | 50 | 22240 | 23720 |

<Assessment 2: Solubility to Cleaning Solution Composition (pH-Dependency) of Abrasive Grains ($CeO_2$ Particles)>

The amount of dissolved cerium oxide was calculated using a similar method to that in Assessment 1 except using cleaning solution compositions having the compositions of Tables 6 and 7. Table 7 and FIG. 11 show the results.

TABLE 7

| | pH | Ce Conc. (ppb) |
|---|---|---|
| Citric acid (15 mM) + | 2.6 | 99.4 |
| No $H_2O_2$ | 5.2 | 128.1 |
| | 7.1 | 97.8 |
| | 8.1 | 95.2 |
| | 9.1 | 95.9 |
| | 12.0 | 109.7 |
| Citric acid (15 mM) + | 2.5 | 434.9 |
| $H_2O_2$ (15 mM) | 5.2 | 241.0 |
| | 6.9 | 98.1 |
| | 8.2 | 14.5 |
| | 9.1 | 1.0 |
| | 11.6 | 142.0 |

<Assessment 3: Measuring Zeta-Potential (Acid-Dependency) of Each of $CeO_2$, $SiO_2$, $Si_3N_4$ and Si Particles in Cleaning Solution Compositions>

Cerium oxide spheroidal powder (0.05 g) having average particle diameter of 0.6 μm was mixed with 20 mL of ultrapure water, stirred for 10 min using an ultrasonic device to an uniform dispersion, and then 0.05 mL of this solution was taken and added to 20 mL of the cleaning solution compositions having the compositions of Table 8. These solution was further stirred to uniformity, and the zeta-potential of cerium oxide was measured with a zeta-potential measuring device (OTSUKA ELECTRONICS Co., Ltd., Model number: ELS-Z2).

For each of silicon oxide, silicon nitride and silicon particles, the zeta-potential (mV) was measured in a similar way to that for cerium oxide.

Table 8 and FIGS. 12-15 show the results.

TABLE 8

| | | $CeO_2$ particle | | $SiO_2$ particle | | $Si_3N_4$ particle | | Si particle | |
|---|---|---|---|---|---|---|---|---|---|
| Acid | Conc (mM) | | +surfactant (100 mM) | | +surfactant (100 mM) | | +surfactant (100 mM) | | +surfactant (100 mM) |
| Citric acid | 50 | −17.7 | −35.0 | −9.2 | −9.7 | −5.2 | −51.4 | −0.5 | −2.5 |
| Glutaric acid | 50 | 22.2 | −50.0 | −10.3 | −11.9 | 33.4 | −47.3 | −0.2 | −6.7 |
| HNO3 | 5 | 32.1 | −53.9 | −3.8 | 2.4 | 27.7 | −48.4 | 3.5 | 11.6 |
| MeSO3H | 5 | 22.4 | −57.8 | −6.9 | −8.1 | 37.3 | −52.6 | 0.3 | −1.7 |
| H2SiF6 | 30 | −45.6 | −98.0 | −8.4 | −15.9 | −58.0 | −92.9 | −19.2 | −25.8 |

<Assessment 4: Measuring Zeta-Potential (pH-Dependency) of $CeO_2$ Particles in Cleaning Solution Compositions>

Cerium oxide spheroidal powder (0.05 g) having average particle diameter of 0.6 μm was mixed with 20 mL of ultrapure water, stirred for 10 min using an ultrasonic device to an uniform dispersion, and then 0.05 mL of this solution was taken and added to 20 mL of the cleaning solution compositions having the compositions of Table 9. These solution was further stirred to uniformity, and the zeta-potential of cerium oxide was measured with a zeta-potential measuring device (OTSUKA ELECTRONICS Co.,Ltd., Model number: ELS-Z2).

Table 9 and FIG. 16 show the results.

TABLE 9

| | pH | Zeta-potential |
|---|---|---|
| Citric acid (15 mM) + | 7.2 | −62.4 |
| Surfactant (100 ppm) | 5.26 | −58.6 |
| | 2.5 | −23.3 |
| | 12.1 | −54.9 |
| | 9.1 | −57.5 |
| | 8.1 | −62.2 |
| Citric acid (15 mM) | 7 | −61.4 |
| | 5.2 | −59.6 |
| | 2.6 | −41.3 |

<Assessment 5: The Cleaning Performance of the Cleaning Solution Composition (Ce Surface Concentration, Number of Defects)>

(Preparation of CMP Polishing Solution)

Cerium oxide slurry having average particle diameter of 0.1 μm (Slurry P, Hitachi Chemical Co., Ltd.) was diluted by 10-fold to give a CMP polishing solution.

(Production of Wafer to be Polished)

On a silicon substrate of 200 mm in diameter, a silicon oxide film of 1000 nm thick was produced by plasma CVD method to give a wafer to be polished.

(Wafer Polishing)

Using the above-described CMP polishing solution, the above-described wafer fto be polished was polished for 30 sec with a polishing device (CMP polishing device from MAT, Model number: ARW-681M511). After finishing the polishing, the wafer was rinsed for 10 sec using 100 mL of ultrapure water (DIW) with rotating. Using cleaning solution compositions having the compositions of Table 10, the wafer was cleaned for predetermined time by rolling a brush made of polyvinylalcohol (SOFU ENGINEERING) over the rinsed wafer while rotating the wafer. The cleaned wafer was rinsed for 30 sec using 300 mL of ultrapure water (DIW) while rotating the wafer, and dried at 25° C. for 30 sec while further rotating to give a wafer for measurement.

(Measuring Ce Concentration and Number of Defects on Wafer Surface)

The Ce concentration and number of defects on the surface of the above-described wafer for measurement were measured with TXRF (total reflection fluorescent X-ray analyzer) (Rigaku Corporation, Model number: 3800e) and surface inspection device (TOPCON CORPORATION, Model number: WM-10), respectively, and the cleaning performance of the cleaning solution composition was assessed. Ce concentration was assessed by means of the number of Ce atoms per 1 cm² of wafer surface, whereas the number of defects were obtained by measuring the number of defects that are present on the wafer surface and over 80 nm by light scattering. Results corresponding to each cleaning solution composition and cleaning time are shown in Table 11.

TABLE 10

| | Acid | | | |
|---|---|---|---|---|
| | | Conc.(mM) | Surfactant (ppm) | $H_2O_2$(mM) |
| Reference Comparative Example 1 | Citric acid | 50 | 100 | 50 |
| Reference Comparative Example 2 | Glutaric acid | 50 | 100 | 50 |
| Reference Comparative Example 3 | Methane sulfonic acid, $HNO_3$ | 10 | 100 | 50 |
| Reference Comparative Example 4 | | 10 | 30 | 50 |
| Reference Comparative Example 5 | | 10 | 5 | 50 |
| Reference Example 1 | $H_2SiF_6$ | 30 | 100 | 50 |
| Reference Example 2 | | 20 | 100 | 50 |
| Reference Example 3 | | 10 | 100 | 50 |
| Reference Example 4 | | 5 | 100 | 50 |
| Reference Example 5 | | 30 | 100 | 0 |
| Reference Example 6 | $HBF_4$ | 30 | 100 | 50 |

TABLE 11

| | Cleaning time (sec) | Ce surface concentration × $10^{10}$ atoms/cm² | Number of defects numbers/wafer($\phi$ > 80 nm) |
|---|---|---|---|
| Reference Comparative Examples 1 | 30 | 139 | 29132 |
| | 60 | 153 | 25817 |
| | 90 | 109 | 5674 |
| | 180 | 108 | 6626 |
| Reference Comparative Examples 2 | 30 | 84.2 | 57290 |
| | 60 | 80.0 | 55826 |
| | 90 | 66.3 | 21540 |
| | 180 | 58.8 | 28879 |
| Reference Comparative Examples 3 | 30 | 97.6 | 14115 |
| | 60 | 87.7 | 12603 |
| | 90 | 73.4 | 1886 |
| | 180 | 70.1 | 2326 |
| Reference Comparative Examples 4 | 30 | 104 | 6871 |
| | 60 | 84.9 | 3594 |
| | 90 | 79.5 | 5146 |
| | 180 | 76.9 | 2926 |
| Reference Comparative Examples 5 | 30 | 97.0 | 18653 |
| | 60 | 78.5 | 13804 |
| | 90 | 80.4 | 7634 |
| | 180 | 62.2 | 9990 |
| Reference Examples 1 | 30 | 23.6 | 6274 |
| | 60 | 14.1 | 1092 |
| | 90 | 10.8 | 842 |
| | 180 | 2.22 | 827 |
| Reference Examples 2 | 30 | 50.8 | 3692 |
| | 60 | 26.8 | 1829 |
| | 90 | 22.8 | 1219 |
| | 180 | 7.3 | 1069 |
| Reference Examples 3 | 30 | 74.1 | 15408 |
| | 60 | 68.9 | 3970 |
| | 90 | 39.7 | 3730 |
| | 180 | 16.2 | 2626 |
| Reference Examples 4 | 30 | 92.9 | 18376 |
| | 60 | 89.1 | 19679 |
| | 90 | 51.1 | 12522 |
| | 180 | 26.7 | 3210 |
| Reference Examples 5 | 30 | 34.4 | 7618 |
| | 60 | 16.8 | 2767 |
| | 90 | 12.3 | 1507 |
| | 180 | 3.47 | 1300 |
| Reference Examples 6 | 30 | 41.0 | 4818 |
| | 60 | 25.8 | 3857 |
| | 90 | 14.0 | 1437 |
| | 180 | 5.77 | 803 |

<Assessment 6: Damaging Property (Etching Rate, Surface Roughness) of Cleaning Solution Composition>
(Production of Wafer (Pre-Immersion))

On a silicon substrate of 200 mm in diameter, a silicon oxide film of 1000 nm thick was produced by plasma CVD method to give $SiO_2$ wafer (pre-immersion).

Moreover, $Si_3N_4$ wafer (pre-immersion) was obtained by LP-CVD method.
(Immersing Wafer in Cleaning Solution Composition)

The above-described $SiO_2$ wafer (pre-immersion) was immersed in 100 mL of the cleaning solution compositions having the compositions of Table 12 and left for 60 min at room temperature. The wafer was then removed, rinsed for 1 min using 5000 mL of ultrapure water (DIW) to give $SiO_2$ wafer (post-immersion).

$Si_3N_4$ wafer (post-immersion) was obtained by immersing the $Si_3N_4$ wafer (pre-immersion) in the cleaning solution compositions and rinsing by a similar way described above.
(Measuring Etching Rate of Cleaning Solution Composition)

The film thickness of the above-described $SiO_2$ or $Si_3N_4$ wafer (pre-immersion) was measured with a reflection spectroscopy thickness monitor (OTSUKA ELECTRONICS Co., Ltd., Model number: FE-3000), and the film thickness of the above-described $SiO_2$ or $Si_3N_4$ wafer (post-immersion) was measured with a reflection spectroscopy thickness monitor (OTSUKA ELECTRONICS Co., Ltd., Model number: FE-3000), and etching rate (E.R.) of the cleaning solution composition for $SiO_2$ or $Si_3N_4$ was calculated from the difference between before and after immersion. Results are shown in Table 12 and 13.

(Measuring Surface Roughness of Wafer (Post-Immersion))

For each of the above-described $SiO_2$ and $Si_3N_4$ wafers (post-immersion), three-dimensional images of wafer surface were obtained using a scanning probe microscope (SII NanoTechnology Inc., Model number: SPA400). Furthermore, Ra (average plane roughness) of the wafer surface was calculated based on measurement date by scanning probe microscope to assess surface roughness. Results are shown in Table 12 and 13 as well as FIGS. 17 and 18.

TABLE 12

$SiO_2$ wafer

| Cleaning liquid composition | Etching rate | Ra (before immersion) | Ra (after immersion) |
|---|---|---|---|
| $H_2SiF_6$ (30 mM) + surfactant (100 ppm) | less than 0.1 nm/min | 0.31 nm | 0.31 nm |
| $H_2SiF_6$ (30 mM) + surfactant (100 ppm) + $H_2O_2$ (50 mM) | less than 0.1 nm/min | | 0.29 nm |

TABLE 13

$Si_3N_4$ wafer

| Cleaning liquid composition | Etching rate | Ra (before immersion) | Ra (after immersion) |
|---|---|---|---|
| $H_2SiF_6$ (30 mM) + surfactant (100 ppm) | less than 0.1 nm/min | 0.32 nm | 0.31 nm |
| $H_2SiF_6$ (30 mM) + surfactant (100 ppm) + $H_2O_2$ (50 mM) | less than 0.1 nm/min | 0.30 nm | |

As is clear from the results above, the cleaning solution composition of this Reference Example exhibits better solubility and pH-stability of abrasive grains, exhibits better performance in generating zeta-potential, which generates a repulsive force between the substrate and abrasive grains, and better pH-stability thereof, leaves less residual abrasive grains on the semiconductor substrate (wafer) after cleaning, and causes little damage to the wafer. Therefore, the cleaning solution composition of this Reference Example will cause no damage to $SiO_2$, $Si_3N_4$ and Si, etc. which constitute substrate surface layers during the cleaning of the semiconductor substrate or glass substrate surface in the processes of manufacturing an electrical device such as a semiconductor element, and can be used under treatment conditions that are applicable to a brush-scrub cleaning chamber that is ancillary to a CMP device (treatment temperature: around room temperature, treatment time: within a few minutes, no erosion to device members), and can increase removing performance to compounds originated from abrasive grains in slurry.

The invention claimed is:

1. A cleaning solution composition for cleaning a semiconductor substrate or glass substrate surface, comprising one or more inorganic acids that contain fluorine atoms within their structure or salts thereof, water, one or more reducing agent, and one or more anionic surfactants, and having hydrogen ion concentration (pH) of less than 7, wherein no hydrofluoric acid is contained as the inorganic acid that contains fluorine atoms within its structure.

2. The cleaning solution composition of claim 1, wherein the inorganic acid that contains fluorine atoms within its structure is hexafluorosilicic acid or hexafluoroboric acid, or combinations thereof.

3. The cleaning solution composition of claim 1, wherein the salt of the inorganic acid that contains fluorine atoms is an ammonium salt, amine salt or quaternary ammonium salt or combination thereof.

4. The cleaning solution composition of claim 1, wherein the reducing agent is selected from a group consisting of five- or six-membered cyclic compounds having two or more hydroxyl groups.

5. The cleaning solution composition of claim 4, wherein five- or six-membered cyclic compound having two or more hydroxyl groups is ascorbic acid, catechol, resorcinol, hydroquinone, pyrogallol or methylcatechol.

6. The cleaning solution composition of claim 1, wherein anionic surfactant is a condensate of naphthalenesulfonic acid and formaldehyde or a salt thereof.

7. The cleaning solution composition of claim 1 for cleaning residual cerium compound on a semiconductor substrate or glass substrate surface after performing chemical machine polishing (CMP) of the semiconductor substrate or glass substrate surface using slurry containing a cerium compound as abrasive grain.

8. A stock solution composition for the cleaning solution composition of claim 1 for use in producing the cleaning solution composition by being diluted by from 10-fold to 1000-fold.

9. A method of manufacturing an electronic device comprising steps of performing chemical machine polishing (CMP) of a semiconductor substrate or glass substrate surface using slurry containing a cerium compound as abrasive grain, and then cleaning residual cerium compound on the semiconductor substrate or glass substrate surface using the cleaning solution composition of claim 1.

* * * * *